(12) United States Patent
Madan et al.

(10) Patent No.: US 6,721,217 B2
(45) Date of Patent: Apr. 13, 2004

(54) METHOD FOR MEMORY SENSING

(75) Inventors: Sudhir K. Madan, Richardson, TX (US); Hugh McAdams, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/185,206

(22) Filed: Jun. 27, 2002

(65) Prior Publication Data

US 2004/0001378 A1 Jan. 1, 2004

(51) Int. Cl.⁷ .................................................. G11C 7/00
(52) U.S. Cl. ........................................ 365/203; 365/205
(58) Field of Search ................................ 365/203, 205, 365/207, 208, 145, 149, 210

(56) References Cited

U.S. PATENT DOCUMENTS

| | | | |
|---|---|---|---|
| 4,081,701 A | 3/1978 | White, Jr. et al. | |
| 4,716,320 A | 12/1987 | McAdams | |
| 5,029,136 A | 7/1991 | Tran et al. | |
| 5,790,467 A | 8/1998 | Haukness et al. | |
| 5,828,615 A * | 10/1998 | Mukunoki et al. | 365/210 |
| 5,831,919 A | 11/1998 | Haukness et al. | |
| 6,028,784 A | 2/2000 | Mori et al. | |
| 6,285,576 B1 * | 9/2001 | Kang | 365/145 |
| 6,310,399 B1 | 10/2001 | Feurle et al. | |
| 6,326,695 B1 | 12/2001 | Numata | |
| 6,351,422 B2 * | 2/2002 | Rohr et al. | 365/203 |
| 6,459,609 B1 * | 10/2002 | Du | 365/145 |
| 6,567,326 B2 * | 5/2003 | Nakazato et al. | 365/203 |

* cited by examiner

Primary Examiner—Gene Auduong
(74) Attorney, Agent, or Firm—Rose Alyssa Keagy; W. James Brady, III; Frederick J. Telecky, Jr.

(57) ABSTRACT

Methods are disclosed for reading data from memory cells such as a ferroelectric memory cell in a memory device, where one sense amp bitline is coupled with a precharge voltage while another sense amp bitline is coupled with the memory cell.

9 Claims, 6 Drawing Sheets

METHOD FOR MEMORY SENSING

FIELD OF INVENTION

The present invention relates generally to semiconductor devices and more particularly to methods for sensing data stored in memory cells in memory devices.

BACKGROUND OF THE INVENTION

Ferroelectric memory devices, and other type semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric (FE) capacitors adapted to store a binary data bit, as well as one or more access transistors, typically MOS devices, operable to selectively connect the FE capacitor to one of a pair of complimentary bitlines, with the other bitline being connected to a reference voltage. The individual cells are commonly organized as individual bits of a corresponding data word, wherein the cells of a given word are accessed concurrently through activation of plate-lines and wordlines by address decoding circuitry.

Ferroelectric memory devices provide non-volatile data storage where data memory cells include capacitors constructed with ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field to the ferroelectric capacitor in excess of the coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complimentary bitline and a plateline signal voltage, and interrogating the cell. There are several techniques to interrogate a FeRAM cell. Two most common interrogation techniques are step sensing and pulse sensing. In both these interrogation techniques, the cell capacitor is coupled to the complimentary bitline by turning ON an access or a pass gate. In the step sensing, the plateline voltage is stepped from ground (Vss) to a supply voltage (Vdd). In the pulse sensing the plateline voltage is pulsed from Vss to Vdd and then back to Vss. This provides a differential voltage on the bitline pair, which is connected to a sense amp circuit. The reference voltage is typically supplied at an intermediate voltage between a voltage ($V_{"0"}$) associated with a capacitor programmed to a binary "0" and that of the capacitor programmed to a binary "1" ($V_{"1"}$). The resulting differential voltage at the sense amp terminals represents the data stored in the cell, which is buffered and applied to a pair of local IO lines.

The transfer of data between the ferroelectric memory cell, the sense amp circuit, and the local data bitlines is controlled by various access transistors, typically MOS devices, with switching signals being provided by control circuitry in the device. In a typical ferroelectric memory read sequence, two sense amp bitlines are initially pre-charged to ground, and then floated, after which a target ferroelectric memory cell is connected to one of the sense amp bitlines and interrogated. Thereafter, a reference voltage is connected to the remaining sense amp bitline, and a sense amp senses the differential voltage across the bitlines and latches a voltage indicative of whether the target cell was programmed to a binary "0" or to a "1".

In modern memory devices having millions of data cells, there is a continuing need to reduce component sizes and otherwise to conserve circuit area in the device, so as to maximize device density. Accordingly, memory cell layout architectures such as folded bit configurations have been developed to conserve on the amount of die area needed to implement large scale memories, like 64 megabit devices. Such devices are typically divided internally into blocks, sections, segments, rows and columns. For example, a 64M device may include 8 blocks of 8M each, each block may consist of 8 sections of 1M each, each section may be 32 segments, with each segment containing 512 words or rows of 64 bits or columns per word. When a data word is read, the cell data from the corresponding bit in each column is sensed using 64 individual sense amplifiers associated with the individual data cell columns.

FIG. 1 schematically illustrates a segment portion of a memory device 2 having 512 rows (words) and 64 columns (bits) of data storage cells $C_{ROW\text{-}COLUMN}$ configured in a folded bitline architecture, where each column of cells is accessed via a pair of complimentary bitlines $BL_{COLUMN}$ and $BL_{COLUMN}'$. One column of the device 2 is illustrated in FIG. 2. The cells C1-1 through C1-64 form a data word accessible via a wordline WL1 and complimentary bitline pairs BL1/BL1' through BL64/BL64', where cell data is sensed during data read operations using sense amp circuits S/A C1 through S/A C64 associated with columns 1 through 64, respectively. In a typical folded bitline architecture ferroelectric memory device, the cells $C_{ROW\text{-}COLUMN}$ individually include one or more ferroelectric cell capacitors and one or more access transistors to connect the cell capacitors between one of the complimentary bitlines associated with the cell column and a plateline, where the other bitline is connected to a reference voltage.

In the device 2, the sense amps associated with even numbered columns are located at the bottom of the segment, whereas sense amps associated with odd numbered columns are located at the top of the segment. In order to reduce the number of components in the device 2, as well as to increase device density therein, individual reference voltage generators are not provided for each complimentary bitline pair. Rather, shared reference generators are provided at the top and bottom of the segment columns. An even column reference generator 8 is provided at the bottom of the segment columns to service the sense amps associated with even numbered columns and an odd column reference generator 8' is provided at the top of the segment columns to service the sense amps associated with odd numbered columns. The reference voltages from the generators 8, 8' are coupled to one of the bitlines in the columns using one of a pair of switches 8a, 8b, depending upon whether an odd or even numbered target data word is being read.

Sharing the reference generators 8, 8' across multiple data columns, however, requires the connection of reference bitlines from all the odd numbered columns to one another, and the connection of reference bitlines from all the even numbered data columns together through the activated switches 8a or 8b. In a standard ferroelectric memory read sequence, the complimentary bitlines are precharged or equalized to ground and then left floating. Then, sense bitlines (e.g., the ones of the complimentary bitlines associated with the cell to be accessed) are connected to the target data cells of interest and the cells are interrogated. The reference generators 8, 8' are then connected to the reference bitlines (the others of the complimentary bitline pairs), so as to establish a differential voltage at the sense amp terminals.

However, due to the physical proximity of the complimentary bitlines to one another, the connection of the sense bitlines to the target cells causes corresponding voltages to be coupled to the floating reference bitlines. These coupled voltages on the reference bitlines depend upon the signal levels on adjacent sense bitlines, including the complimentary sense bitline and the sense bitline from the adjacent column. For example, in reading the first data word of the illustrated segment along wordline WL1 in the device 2, the cells C1–1 through C1–64 are connected to the sense bitlines BL1, BL2 . . . , BL63, and BL64 while the complimentary reference bitlines BL1', BL2' . . . , BL63', and BL64' are floating. At this point, the induced voltage on the reference bitline BL1' is a function of the voltages on the adjacent sense bitlines BL1 and BL2. When the reference bitlines BL1', BL2' . . . BL63', and BL64' are thereafter connected to the reference voltage generators 8, 8' (with odd column reference bitlines BL1', BL3' . . . , and BL63' connected to one another and even column reference bitlines BL2', BL4' . . . , and BL64' connected to one another), the reference voltages thereon are a function of both the ideal, $V_{REF0}$, reference generator voltage and the average voltage induced on the connected reference bitlines. The average induced voltage may differ for the even and odd columns, Here the ideal reference generator voltage, $V_{REF0}$ is referred to as the voltage it would produce on the reference bitlines in the absence of any induced voltage from adjacent bitlines. Note that typically a reference voltage generator is not a perfect voltage source. It is usually based on sharing charges between various capacitors. Any induced voltage or charge on any reference bitline will impact the final voltage, $V_{REF}$ on the reference bitlines.

The voltages on the even and odd reference bitlines is thus not necessarily equal to the ideal value of the voltage generators 8 or 8' when the bitlines are connected to the sense amp circuits. Rather, the reference bitline voltage is roughly the sum of the ideal reference voltage, $V_{REF0}$, plus a voltage which is a function of the average voltage induced on the interconnected reference bitlines. Moreover, the voltage on the reference bitlines varies depending upon the data being sensed in the target cells, because the induced voltage is dependent upon the values of the data cells in the data word being read.

The offset and variability in the value of voltage at the reference terminal of the sense amp circuit reduces the sense margin for ascertaining the value of data stored in the ferroelectric memory cells. Bitline twist techniques have been used to reduce the cross coupling between sense bitlines and reference bitlines during read operations. However, these layout techniques are not perfect and result in only marginal improvement, and may also be difficult to implement, particularly while reducing device sizes and increasing device densities in memory devices. Thus, there is a need for improved apparatus and methods for sensing data stored in ferroelectric memory cells by which adverse effects of cross-coupled reference bitline voltages can be reduced or mitigated alone or in combination with such bitline twist approaches.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention provides memory devices comprising one or more memory cells, such as ferroelectric memory cells connected to one of first and second data bitlines and a reference connected to another of the first and second data bitlines during a read operation. A sense amp and a precharge circuit are provided, where the precharge circuit couples one sense amp bitline to a precharge voltage while the other sense amp bitline is connected to the ferroelectric memory cell. This may be employed, for example, to discharge induced voltages from the reference bitlines due to connection of memory cells to the adjacent sense bitlines during a memory read operation. In one implementation, the reference and sense bitlines of the sense amp circuit are initially coupled to the precharge voltage, such as VSS or ground, and thereafter the sense bitlines are connected to the data cells while the reference bitlines are held at VSS. With the reference bitlines thus maintained at a constant potential, the induced charge associated with connection of the sense bitlines to the ferroelectric data cells is discharged to ground.

Thereafter, the reference bitlines are decoupled from the precharge voltage and connected to the reference generators, and the sense amp circuit senses the differential voltage applied across the sense amp bitlines. Since the induced voltage resulting from the sense bitline connection with the cells is dissipated before connecting the reference voltage generator, the sense margin of the sense amp circuit is not impacted by the coupling between reference bitlines and adjacent sense bitlines. Thus, the invention may be employed to reduce or avoid reference bitline offset problems experienced in conventional designs. Moreover, the invention may be employed to reduce the variance in the reference bitline voltage, since the variation in the data stored in the target cells of interest no longer affects the reference bitline voltage value. In the new technique there may be coupling from the reference bitlines to the sense bitlines when the reference voltage is generator is coupled to the reference bitlines. However, this coupling will be same for all the sense bitlines and is of less concern.

Another aspect of the invention provides methods for sensing data from a ferroelectric or other type memory cell in a memory device, comprising coupling a first sense amp bitline to the memory cell while a second sense amp bitline is coupled to a precharge voltage, and thereafter decoupling the second sense amp terminal and coupling the second sense amp bitline with a reference. The methods of the invention may be employed to reduce or mitigate the effects of cross-coupled bitline voltages in ferroelectric and other type memory devices, alone or in combination with interconnection layout techniques such as twisted bitline approaches.

To the accomplishment of the foregoing and related ends, the following description and annexed drawings set forth in detail certain illustrative-aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
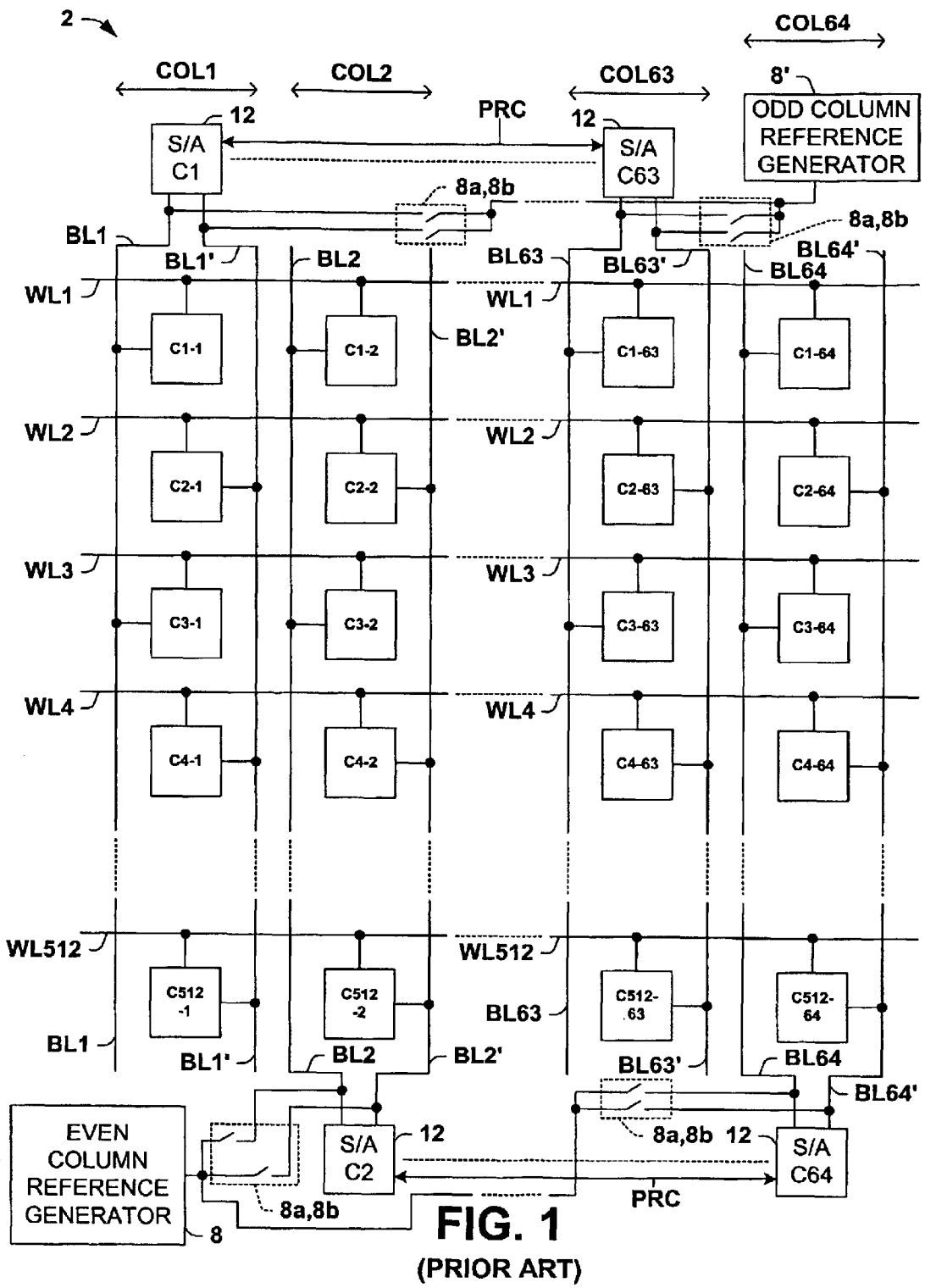
FIG. 1 is a schematic diagram illustrating a segment portion of a conventional folded bitline ferroelectric memory device.

The present invention will now be described with reference to the attached drawings, wherein like reference numerals are used to refer to like elements throughout. The invention relates to memory apparatus and methodologies, which may be employed in read operations to mitigate or reduce the adverse effects associated with sense amp reference bitline coupling from adjacent or proximate sense bitlines. One or more exemplary implementations of the various aspects of the invention are hereinafter illustrated and described in the context of ferroelectric memory devices comprising single transistor, single capacitor (1T1C) memory cells organized in folded bitline architectures, in which one sense amp bitline is coupled with a precharge voltage after or while another sense amp bitline is coupled with the memory cell being sensed. However, it will be appreciated by those of ordinary skill in the art that the invention is not limited to such ferroelectric memory applications, and that the illustrations and descriptions provided herein are exemplary in nature.

Figure 2:
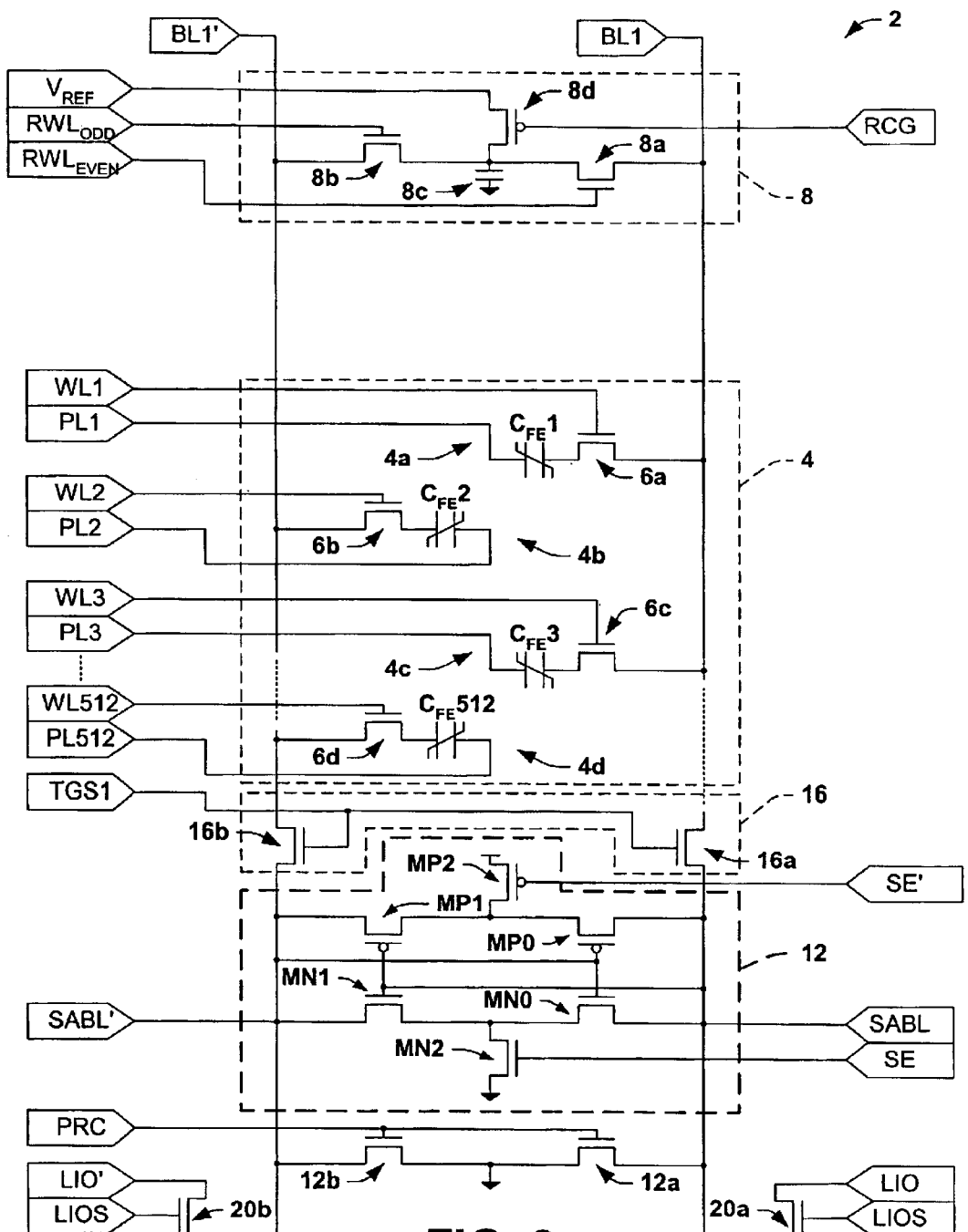
FIG. 2 is a schematic diagram illustrating a portion of a column of the memory device of FIG. 1.

The inventors have found that the invention may be employed to reduce or minimize the reference bitline coupling problems in folded bitline architecture ferroelectric memory devices, such as the device 2 of FIGS. 1 and 2. The device 2 consists of a data cell column of 512 1T1C ferroelectric (FE) memory cells, four of which 4a–4d are illustrated in FIG. 2. FE capacitors $C_{FE}1$–$C_{FE}512$ and MOS access transistors 6a–6d are configured in the column along a pair of complimentary bitlines BL1 and BL1'. The cells 4a–4d and the contents thereof are accessed during read, restore, and write operations via the bitlines BL1 and BL1' using wordline and plateline signals WL1–WL512 and PL1–PL512, respectively. Typically in FERAM, adjacent plate lines in a group are shorted together to reduce the number of plate line drivers. For example, the platelines PL1–PL32 could be shorted together and driven by only one driver. In this example, 512 plate lines would require only 16 plate line drivers. For a cell to be interrogated, both plate and word lines are ON. Since only one word line is turned ON at a given time, the cell to be interrogated is uniquely defined. The FE capacitors in odd numbered data words, such as $C_{FE}1$ and $C_{FE}3$ may be connected to the bitline BL1 via WL1 and PL1 or WL3 and PL3, respectively, and FE capacitors $C_{FE}2$ or $C_{FE}512$ in even numbered data words may be connected to the bitline BL1' via WL2 and PL2 or WL512 and PL512, respectively.

A reference voltage $V_{REF}$ is applied to the other data cell column bitline from a shared reference voltage generator 8 using a transistor 8a or 8b via reference wordline signals $RWL_{ODD}$ or $RWL_{EVEN}$ and a precharged reference capacitor 8c, which is typically precharged to the supply voltage using a transistor 8d according to a reference cell gate signal RCG. As discussed above, the reference generator 8 is shared among a number of data cell columns. That is, the reference generator capacitor 8c and transistor 8d are common to all the columns attached to a reference generator. However, the transistors 8a and 8b are unique to each column. A conventional cross-coupled latch sense amp circuit 12 is provided having sense amp bitlines SABL and SABL', which is enabled using sense amp enable signals SE and SE'. The data and sense amp bitline pairs BL1/BL1' and SABL/SABL' are connectable to one another via transistors 16a and 16b, respectively, of a sense amp connect circuit 16 using a signal TGS1. The sense amp bitlines SABL/SABL' are connectable to local IO lines LIO/LIO', respectively, via an IO select circuit comprising transistors 20a and 20b according to a local IO select signal LIOS.

During read operations, bitlines BL1 and BL1' and the sense amp bitlines SABL and SABL' are initially precharged to VSS or ground using transistors 16a and 16b and 12a and 12b via a precharge signal PRC with the switches 16a and 16b closed via actuation of the TGS1 signal, and then floated. Then, sense bitlines (e.g., the ones of the complimentary bitlines associated with the cells to be accessed) are connected to the target data cells of interest. For example, when the first cell 4a is to be read, the bitlines BL1/SABL are sense bitlines, and the complimentary bitlines BL1'/SABL' are reference bitlines. However, the connection of the data cell 4a to the sense bitlines BL1/SABL causes a corresponding voltage to be coupled to the floating reference bitlines BL1'/SABL'.

When the reference generator capacitor 8c is thereafter connected to the reference bitlines BL1'/SABL' via the transistor 8b, the resulting voltage on the sense amp reference bitline SABL' is a function of the reference generator voltage $V_{REF0}$ and the voltage on sense bitline BL1/SABL (e.g., as well as other sense bitlines adjacent or proximate the reference bitline SABL'). Further, the connection of multiple reference bitlines to one another to share a single reference generator causes the resulting voltage thereon to be a function of the reference voltage and voltages induced on all such interconnected reference bitlines in the memory segment. For example, the inventors have found that the induced voltage imparted onto the reference bitline SABL' can be as much as about 30–40 mV, which is significant in circuits where the sense margin for differentiating between a cell programmed to a "0" and a cell programmed to a "1" may be only 100–200 mV. Thus, the inventors have appreciated that induced offset and the variability in reference bitline voltage is a shortcoming of conventional folded bitline memory devices, such as device 2, particularly where reference voltage generators are shared among several reference bitlines.

Figure 3:
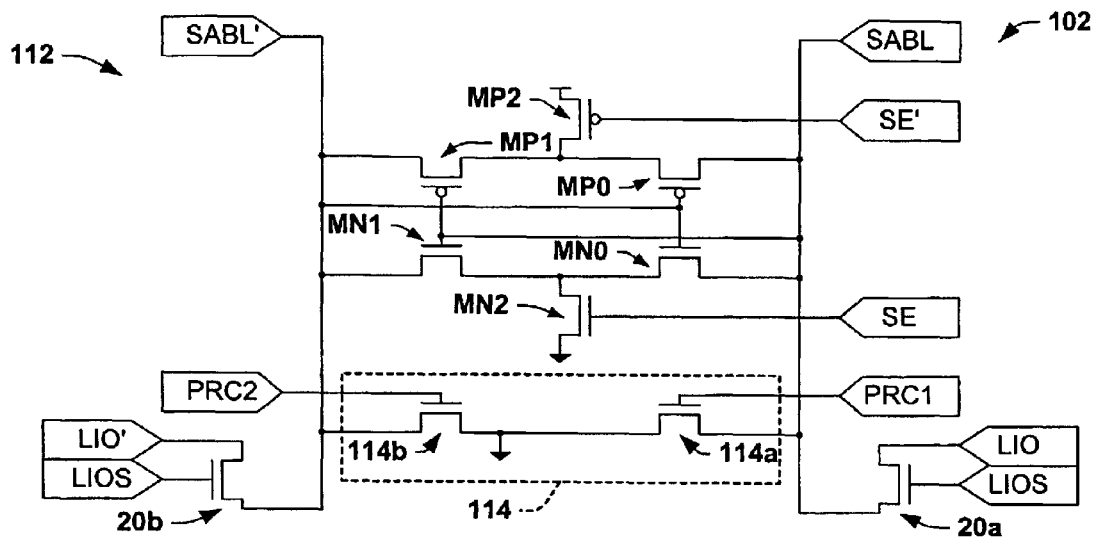
FIG. 3 is a schematic diagram illustrating exemplary sense amp and precharge circuits in a ferroelectric memory device in accordance with the present invention.

The invention provides methods and apparatus which may be employed to reduce or eliminate these voltages prior to connection of the reference voltage to the reference bitline. FIGS. 3–7B illustrate an exemplary folded bitline architecture ferroelectric memory device 102, wherein FIG. 3 illustrates exemplary sense amp and precharge circuits 112 and 114, respectively, in accordance with the invention. Although illustrated and described hereinafter as part of the sense amp circuit 112, the precharge circuit 114 and other precharge circuitry in accordance with the invention may be a separate circuit and may be employed in association with other sense amp circuits apart from the exemplary sense amp circuit 112 illustrated and described herein. In addition, it will be appreciated that the various aspects of the invention may be employed in association with memory devices of different sizes and configurations than the exemplary folded bitline device 102 illustrated and described herein.

Figure 5:
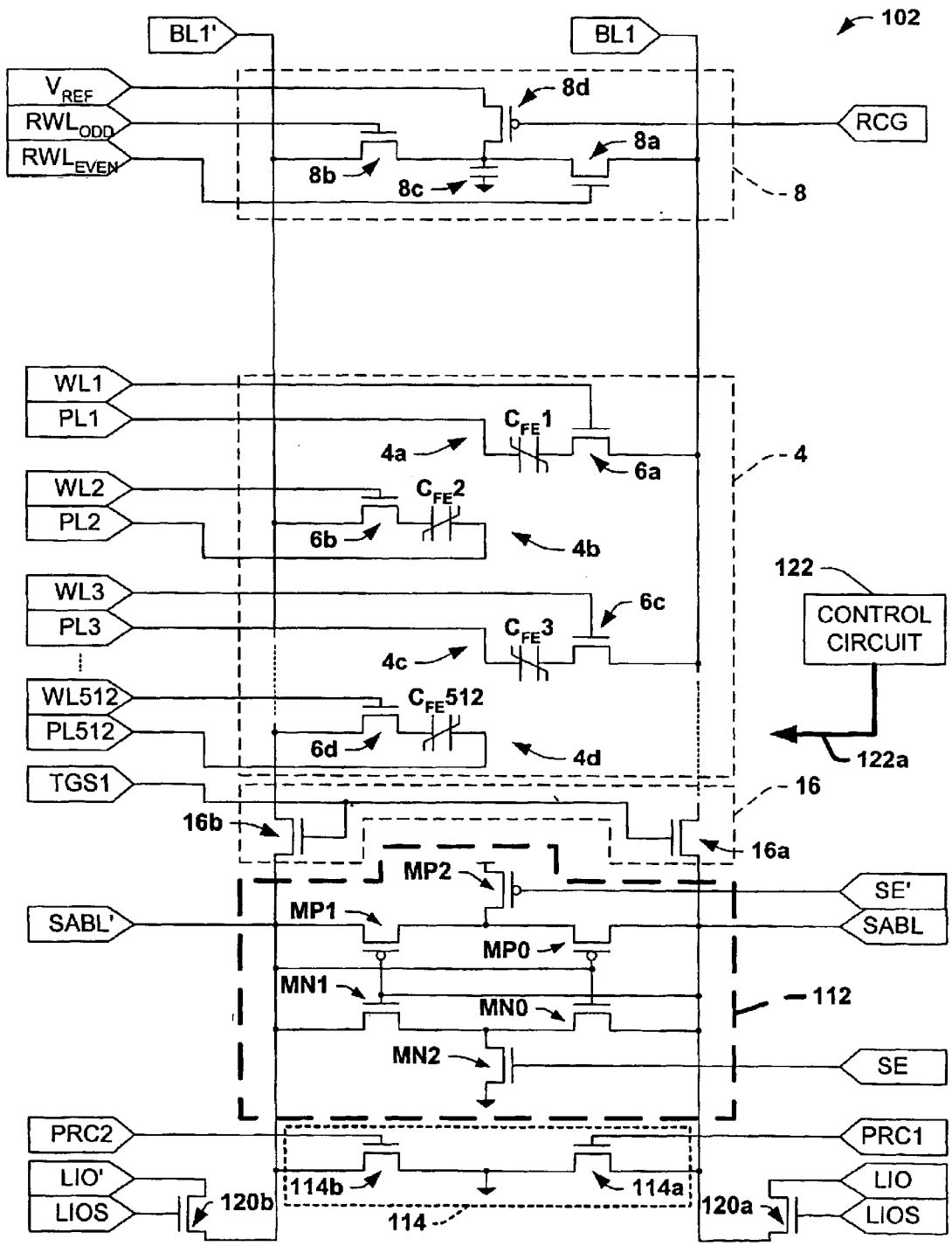
FIG. 5 is a schematic diagram illustrating a portion of a memory column in the device of FIGS. 3 and 4.

As illustrated in to FIGS. 3 and 5, the memory device 102 comprises ferroelectric memory cells 4 organized in rows and columns, wherein 512 cells 4 are connected to first or second data bitlines BL1 or BL1', respectively, during a read operation, depending upon whether the cell of interest is associated with an odd or an even numbered data word. Certain of the components of the device 102 are similar to those described above with respect to the memory device 2 of FIG. 2 and are similarly numbered, wherein the description thereof is omitted for the sake of brevity.

The exemplary precharge circuit 114 comprises first and second MOS transistor type switching components 114a and 114b to selectively connect first and second sense amp bitlines SABL and SABL' to VSS or ground during the read operation, according to first and second precharge signals PRC1 and PRC2, respectively. The precharge signals PRC1 and PRC2 in the exemplary device 102 are provided independently by a control circuit 122, as illustrated and described in greater detail below with respect to FIGS. 7A and 7B. Other switching components are contemplated and other implementations are possible wherein the switches 114a and 114b connect the sense amp bitlines SABL/SABL' to a precharge voltage, which may, but need not be ground within the scope of the invention. Also, the switches 114a and 114b could be replaced by PMOS transistors or a combination of NMOS and PMOS transistors with appropriate control signals.

In the following description, certain ones of the sense amp bitlines SABL/SABL' and the data bitlines BL1/BL1' are variously referred to as "sense bitline" and "reference bitline". These terms are used herein to indicate the read operation specific association of certain bitlines with either the memory cell being sensed or the reference generator 8, depending upon which cell is being sensed. During a particular read operation, one of the sense amp bitlines SABL/ SABL' is destined for connection with the reference voltage $V_{REF}$ and is referred to herein as a reference bitline with respect to the read operation. The other sense amp bitline is coupled with the sensed cell 4 during portions of the read operation, and is referred to as the sense bitline. It will be appreciated in this regard, that the same sense amp bitline may be the reference bitline during one read operation and the sense bitline in another read operation, depending upon which cell is being accessed in the column.

For instance, when memory cell 4a is targeted in a read operation (e.g., when odd numbered data words in the segment are read), the data bitline BL1 and the sense amp bitline SABL are associated with the cell 4a and are termed sense bitlines, while the other bitlines BL1' and SABL' are associated with the reference voltage $V_{REF}$ (e.g., via transistor 8b and signal $RWL_{ODD}$ from the control circuit 122), and hence are termed reference bitlines with respect to that read operation. Alternatively, when an even numbered data word is read, for example, where the data in the cell 4b is sensed, bitlines BL1' SABL' are associated with the cell 4b and are termed sense bitlines, while the other bitlines BL1 and SABL are associated with the reference voltage $V_{REF}$ (e.g., via transistor 8a and signal $RWL_{EVEN}$), and hence are termed reference bitlines with respect to that read operation.

Figure 4:
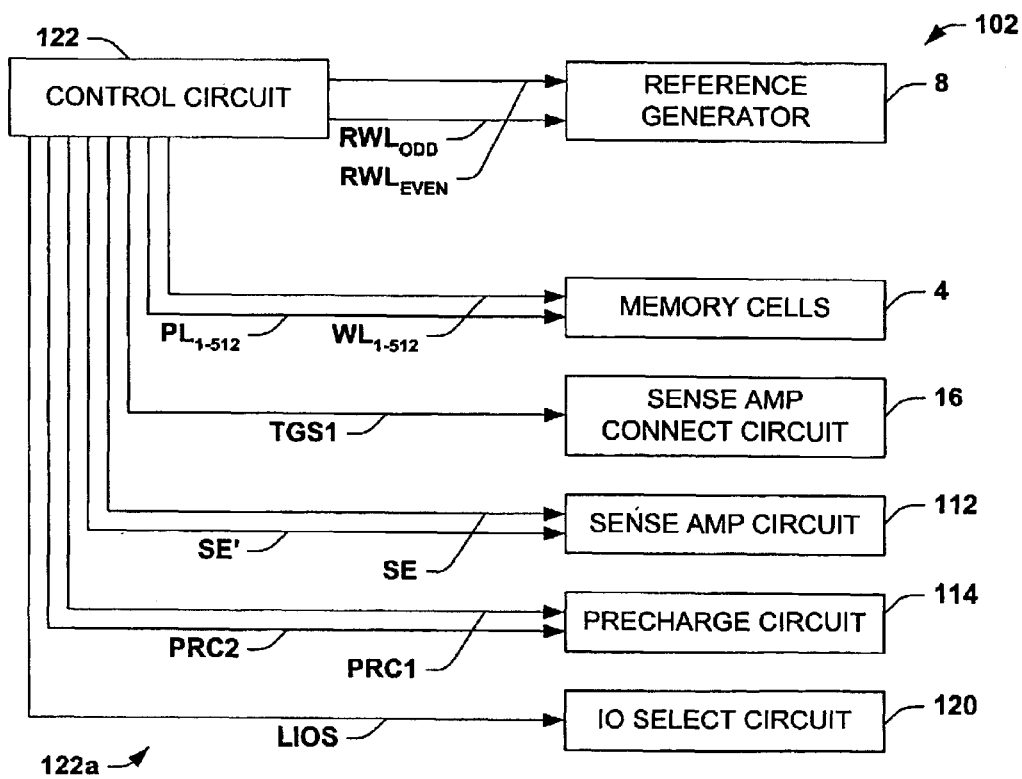
FIG. 4 is a schematic diagram illustrating an exemplary control circuit providing timing and control signals to the precharge circuit in the device of FIG. 3.

Referring also to FIG. 4, the exemplary control circuit 122 provides various other timing and/or control signals 122a for operation of the switching elements in the memory 102 device, in addition to the precharge signals PRC1 and PRC2. The control circuit 122 may be fashioned from logic and/or other components as are known in order to implement the functionality of the various signals 122a in accordance with the invention. It is noted at this point that control circuitry for providing the precharge signals PRC1 and PRC2 may be separate from circuitry providing the other signals 122a, or may be integrated into a single control circuit 122 as described herein. As illustrated in FIGS. 4 and 5, the exemplary control circuit 122 also provides reference wordline signals $RWL_{ODD}$ and $RWL_{EVEN}$ to the reference generator circuit 8 for selective connection of the reference voltage $V_{REF}$ to the reference bitline.

Figure 6:
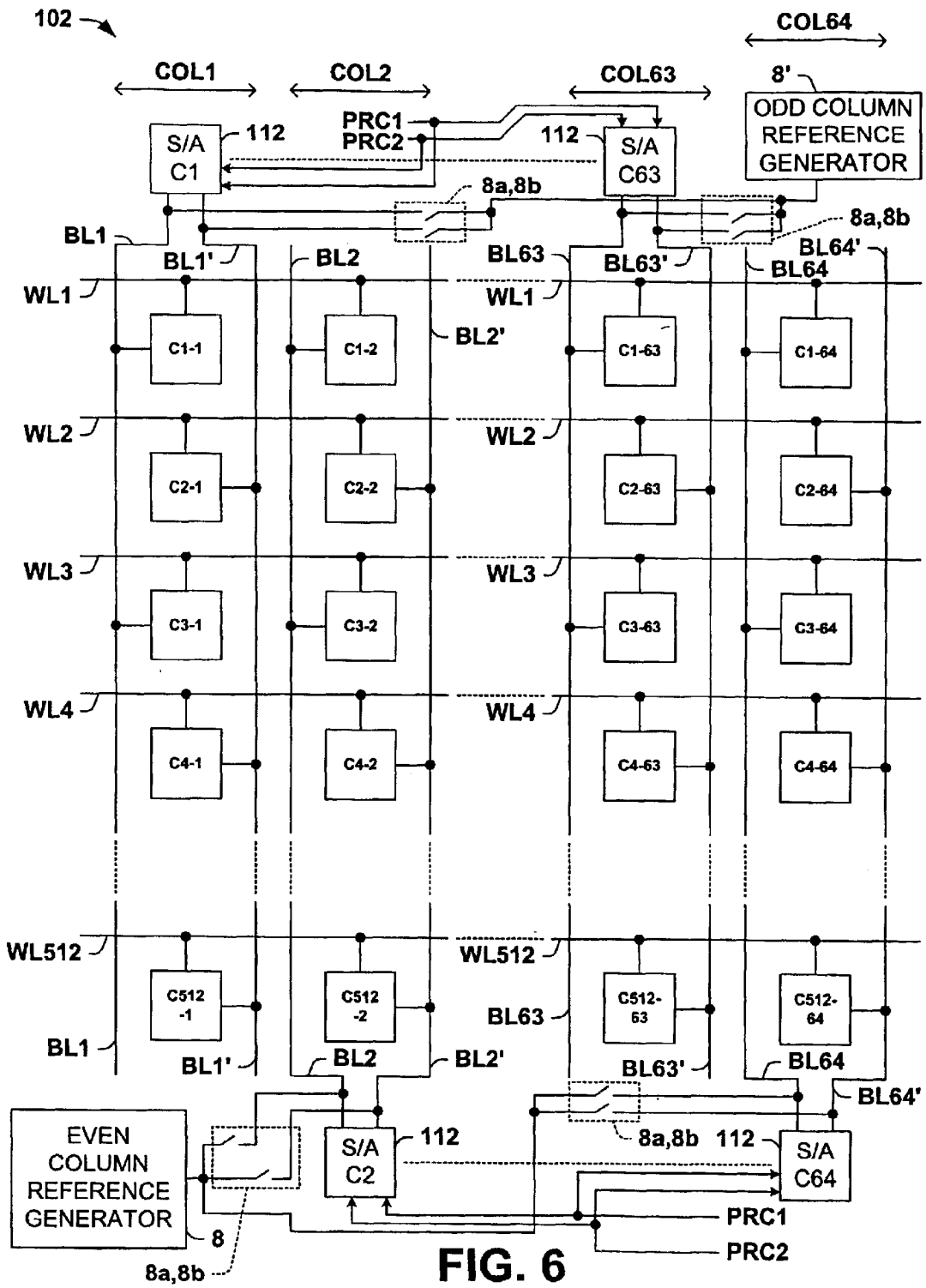
FIG. 6 a schematic diagram illustrating a segment portion of the exemplary memory device of FIGS. 3–5.

The control circuit 122 further provides appropriate wordline and plateline signals WL1–WL512 and PL1–PL512, respectively, to the memory cells 4 in the device 102. As mentioned earlier, to reduce the number of plate line driver and also plate line control signals, several platelines can be grouped together. For example, platelines PL1–PL32 could be shorted and called PL1–32. In that case, there will be 16 plate groups PL1–32 . . . PL481–512. The number of plate group selected is a trade off between number of plate line drivers, area per plate driver, and capacitance per plate group. These signals may be derived at least in part from address decoding circuitry (not shown) in the memory 102, taking into account the particular organization of the device 102 into blocks, section, segments, columns, rows, etc. As illustrated in FIG. 6, the exemplary device 102 comprises a 64M memory core with eight blocks of 8M each. Each block comprises 8 sections of 1M each and each section comprises 32 segements, with each segment comprising 512 words or rows of 64 bits or columns per word.

When a data word is read, the cell data from the corresponding bit in each column is sensed using 64 individual sense amplifiers, wherein a portion of one such segment is illustrated in FIG. 5. The control circuit 122 additionally provides a T gate select signal TGS1 to the sense amp connection circuit 16 for connecting the data bitlines BL1/ BL1' with the sense amp bitlines SABL/SABL' during read and other operations via transistors 16a and 16b, as well as sense amp enable signals SE/SE' to transistors MP2 and MN2 of the sense amp circuit 112. In addition, the circuit 122 provides a local IO select switching control signal LIOS to the IO select circuit 120 to selectively connect the sense amp bitlines SABL/SABL' to local IO lines LIO and LIO' via transistors 120a and 120b, respectively.

Figure 7A:
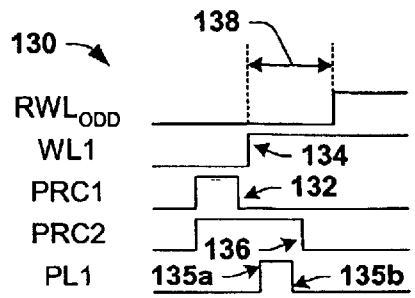
FIGS. 7A and 7B are exemplary timing diagrams illustrating exemplary first and second precharge signals in accordance with the invention.
Figure 7B:
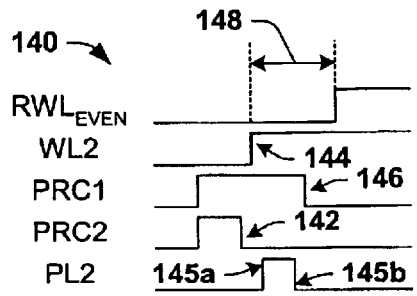

Referring now to FIGS. 3, 5, 7A and 7B, the exemplary precharge circuit 114 initially connects the bitlines BL1 and BL1', as well as the sense amp bitlines SABL and SABL' to the precharge voltage (e.g., ground in the device 102) by the control circuit 122 driving the signals PRC1 and PRC2 high with the TGS1 signal keeping switching devices 16a and 16b ON. The transistors 114a and 114b thus initially equalize or precharge the bitlines BL1/BL1' and SABL/SABL' to a known potential before coupling with a reference voltage $V_{REF}$ from the reference circuit 8 and the data cell 4 being sensed. In FIG. 7A, a timing diagram 130 illustrates the control signals $RWL_{ODD}$, WL1, PRC1, PRC2 and PL1 for a portion of a read operation targeting cells (e.g., cell 4a of FIG. 5) of a first data word along wordline WL1. FIG. 7B illustrates a timing diagram 140 with signals RWL$_{EVEN}$, WL2, PRC1, PRC2 and PL2 for a portion of a read operation targeting cells of a second data word along wordline WL2. During the portion of the read operation illustrated in the timing diagrams 130 and 140, the transistors 16a and 16b of the sense amp connection circuit 16 are on via the signal TGS1, thereby connecting the sense amp bitlines SABL/SABL' with the data bitlines BL1/BL1'. Note that the transistors 16a and 16b could optionally be completely omitted. In that case the SABL/SABL' will directly connect to the BL1/BL1'. Another option is to connect the pre-charge circuit directly to the sense and reference bitlines (BL1/BL1') out side the sense amp circuit. In that case, the SABL/SABL1 will be discharged to the pre-charge voltage by keeping the transistors 16 and 16b ON.

To read the data word along WL1, the precharge circuit 114 couples the reference bitline SABL' and the sense bitline SABL to the precharge voltage (e.g., ground) through transistors 114a, 114b, and thereafter decouples the sense bitline SABL (e.g., and hence BL1) from the precharge voltage at time 132 (FIG. 7A) when the first precharge signal PRC1 goes low. The control circuit 122 maintains the signal PRC2 high thereafter until time 136, during which time the wordline WL1 goes high to thereby couple the sense bitline SABL with the target cell 4a at time 134. The plate voltage PL1 (or PL1–32 if 32 plate lines are grouped together) is appropriately pulsed from times 135a to 135b to interrogate the cell. For best results, the time 135b should be before time 136. The interrogation results in a signal developing on the bitline BL1 and sense bitline SABL1. This timing sequence effectively maintains the reference bitline SABL' at a stable voltage during the period when the coupling of the data cell 4a to the sense bitline SABL (e.g., and the coupling of other cells 4 in the device 102 to adjacent or proximate sense bitlines) could subject the reference bitline SABL' to induced voltages. Thus, the precharge circuit 114 advantageously discharges such induced voltages to ground so that when the reference voltage V$_{REF}$ is subsequently coupled to the reference bitline SABL' at the end of time period 138, any such induced voltages are dissipated. Thus, the voltage on the reference bitline SABL' when the sense amp 112 begins to sense the differential voltage across the bitlines SABL/SABL' is not subjected to offsets or variations experienced in conventional devices, such as the memory 2 of FIGS. 1 and 2.

Although the exemplary control circuit 122 and precharge circuit 114 initially connect both the sense bitline SABL and the reference bitline SABL' to the precharge voltage (e.g., ground) and then couple the sense bitline to the memory cell 4 (time 134) while the reference bitline SABL' is still coupled to the precharge voltage, other implementations are contemplated within the scope of the invention by which the reference SABL' bitline is coupled with a precharge voltage during the time period 138 when the wordline WL1 is active high and the reference voltage V$_{REF}$ is not yet connected to the reference bitline.

In this manner, the invention may be advantageously employed to mitigate or avoid the adverse effects of induced voltages on the referenced bitlines due to connection of the data cells 4 with the sense bitlines in the device 102. Thus, in FIG. 7A, any implementation which couples the reference bitline with the precharge voltage (e.g., signal PRC2 high) during any portion of the period 138 is contemplated as falling within the scope of the present invention and the appended claims. Moreover, the invention contemplates coupling of the reference bitline to the precharge voltage any time after the data cell is coupled with the sense bitline and before the reference bitline is coupled with the reference voltage, whether or not the cell remains coupled with the sense bitline when the reference bitline is coupled with the precharge voltage.

Similar operation is provided for read operations targeting an even numbered data word in the memory 102. In FIG. 7B, signal timing 140 is illustrated for a read operation targeting the data word along WL2, wherein the precharge circuit 114 initially couples the reference bitline SABL and the sense bitline SABL' to the precharge voltage, and thereafter decouples the sense bitline SABL' from the precharge voltage at time 142 when the second precharge signal PRC2 goes low. The first precharge signal PRC1 is held high thereafter until time 146, in which time the wordline WL2 goes high at time 144 to couple the sense bitline SABL' with the target cell 4b. The plate voltage PL2 (or PL1–32 if 32 plate lines are grouped together) is appropriately pulsed from times 145a to 145b to interrogate the cell. For best results, the time 145b should be before time 146. The interrogation results in a signal developing on the bitline BL1' and sense bitline SABL1'. Thereafter at the end of period 148, the reference voltage V$_{REF}$ is coupled with the reference bitline SABL and the sense amp 112 can sense the differential voltage to ascertain the data in the cell 4b.

Figure 8:
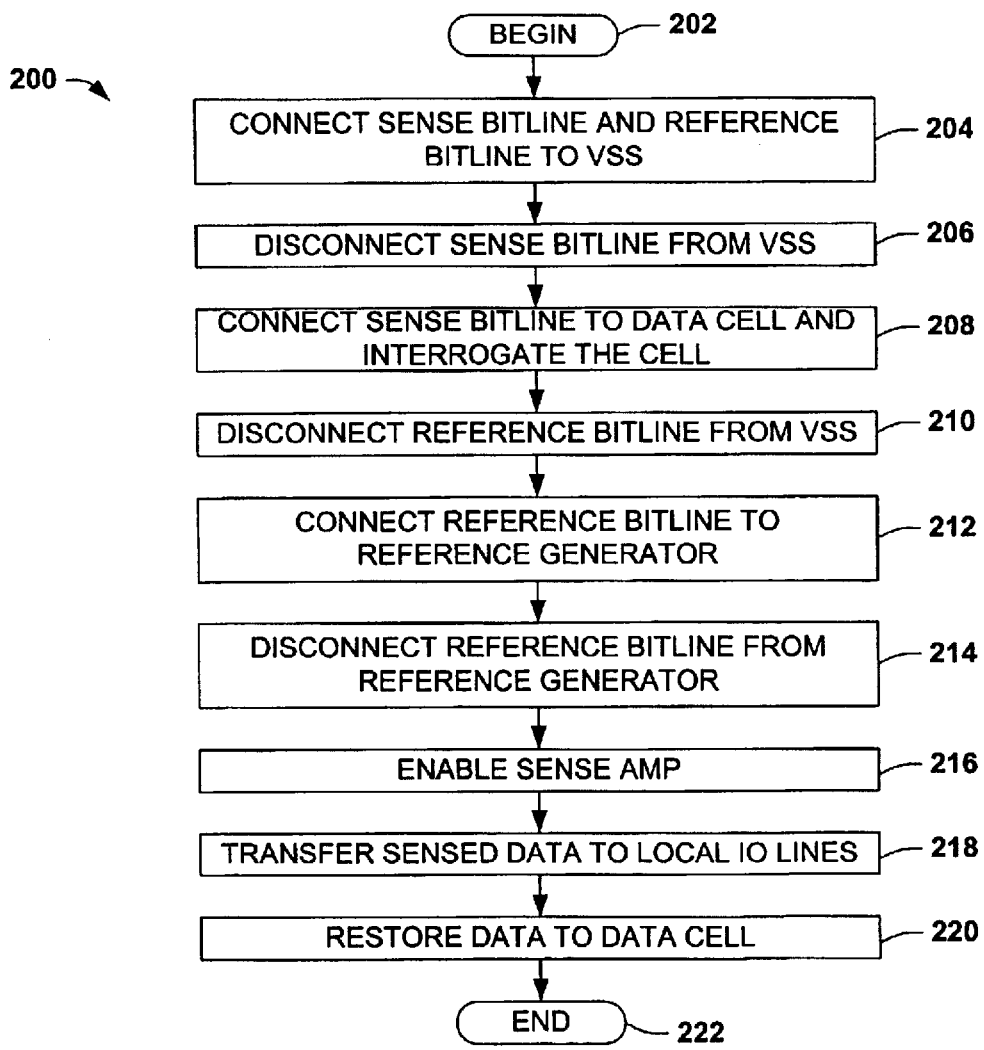
FIG. 8 is a flow diagram illustrating an exemplary method of sensing data from a ferroelectric memory cell in accordance with another aspect of the invention.

Referring now to FIG. 8, another aspect of the invention provides methods for operating ferroelectric memory devices during read operations. An exemplary method 200 is illustrated in FIG. 8 for sensing data from a ferroelectric memory cell in a memory device in accordance with the invention. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein as well as in association with other structures not illustrated.

Beginning at 202, the exemplary method 200 comprises coupling a first sense amp bitline with the ferroelectric memory cell, and thereafter discharging induced voltage from a second or reference sense amp bitline, before coupling the second sense amp bitline with a reference. At 204, sense and reference bitlines are coupled to a predetermined potential, such as ground or VSS. The sense bitline is then decoupled from VSS at 206 and coupled with a data cell at 208. Thereafter at 210, the reference bitline is decoupled from VSS and coupled to a reference generator at 212. The reference generator is then decoupled from the reference bitline at 214 and a sense amp is enabled at 216. Sensed data is then transferred to local IO lines at 218 and the sensed data is restored to the data cell at 220 before the method 200 ends at 222.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of sensing data from a memory cell in a memory device, the method comprising:
    coupling a first sense amp bitline to the memory cell while a second sense amp bitline is coupled to a precharge voltage; and
    thereafter decoupling the second sense amp bitline from the precharge voltage and coupling the second sense amp bitline with a reference.

2. The method of claim 1, wherein coupling the first sense amp bitline to the memory cell while the second sense amp bitline is coupled to the precharge voltage comprises:
    coupling the first and second sense amp bitlines to the precharge voltage;
    then decoupling the first sense amp bitline from the precharge voltage; and
    then coupling the first sense amp bitline to the memory cell while the second sense amp bitline is still coupled to the precharge voltage.

3. The method of claim 1, wherein coupling the first sense amp bitline to the memory cell while the second sense amp bitline is coupled to the precharge voltage comprises coupling the first sense amp bitline to the memory cell while the second sense amp bitline is grounded.

4. The method of claim 1, wherein coupling the first sense amp bitline to the memory cell while the second sense amp bitline is coupled to the precharge voltage comprises coupling the memory cell to the first sense amp bitline while the second sense amp bitline is coupled to the precharge voltage or coupling the precharge voltage to the second sense amp bitline while the first sense amp bitline is coupled to the memory cell or coupling the memory cell to the first sense amp bitline while coupling the precharge voltage to the second sense amp bitline.

5. A method of sensing data from a memory cell in a memory device, the method comprising:
    coupling a first sense amp bitline with the memory cell;
    discharging induced voltage from a second sense amp bitline after coupling the first sense amp bitline with the memory cell; and
    coupling the second sense amp bitline with a reference after discharging the induced voltage therefrom.

6. The method of claim 5, wherein discharging the induced voltage comprises coupling the second sense amp bitline with a precharge voltage after coupling the first sense amp bitline with the memory cell and before coupling the second sense amp bitline with the reference.

7. The method of claim 5, wherein the memory cell comprises at least one ferroelectric capacitor, further comprising providing a plateline voltage to the memory cell while discharging the induced voltage to provide a differential voltage on the first and second sense amp bitlines.

8. The method of claim 7, wherein providing the plateline voltage to the memory cell comprises stepping a terminal of the memory cell from ground to a supply voltage.

9. The method of claim 7, wherein providing the plateline voltage to the memory cell comprises pulsing a terminal of the memory cell from ground to a supply voltage and then back to ground.

* * * * *